(12) United States Patent
Wu

(10) Patent No.: US 7,041,527 B2
(45) Date of Patent: May 9, 2006

(54) CHARGE COUPLED DEVICE PACKAGE

(75) Inventor: Liang-Chung Wu, Hsin-Chu (TW)

(73) Assignee: Harvatek Corp., Hsinchu (TR)

( * ) Notice: Subject to any disclaimer, the term of this patent is extended or adjusted under 35 U.S.C. 154(b) by 0 days.

(21) Appl. No.: 10/919,498

(22) Filed: Aug. 17, 2004

(65) Prior Publication Data

US 2005/0019985 A1 Jan. 27, 2005

Related U.S. Application Data

(62) Division of application No. 08/902,223, filed on Jul. 29, 1997, now abandoned.

(51) Int. Cl.
*H01L 21/00* (2006.01)
(52) U.S. Cl. ........................ 438/65; 438/113; 438/667; 257/431; 257/432; 257/433; 257/434
(58) Field of Classification Search ............ 438/65, 438/113, 667; 257/431–434

See application file for complete search history.

(56) References Cited

U.S. PATENT DOCUMENTS 5,729,437 A * 3/1998 Hashimoto ................. 361/760
5,882,949 A * 3/1999 Okazaki ..................... 438/26
6,383,835 B1 * 5/2002 Hata et al. .................. 438/65

* cited by examiner

*Primary Examiner*—Luan Thai
(74) *Attorney, Agent, or Firm*—Rosenberg, Klein & Lee

(57) ABSTRACT

An image sensor chip is mounted on a printed wiring frame over a substrate, which is plated with a spider web of plated conductors connecting the chip through plated through conduit which wraps around the edge of the substrate to form pads at the bottom of the substrate as output terminals for connection to a printed circuit board. After wiring bonding the chip to the plated conductor, the package is sealed. The structure is amenable to mass production. A large number of printed wiring frames are arranged as a matrix on a common substrate The frames are sealed column by column or sealed all at once. After sealing, the common substrate are diced into individual packages. The image sensor package may mounted with integrated circuit chips as peripheral circuits. The image sensor chips may be sealed with transparent glue and the integrated circuit chip may be sealed with opaque glue.

10 Claims, 20 Drawing Sheets

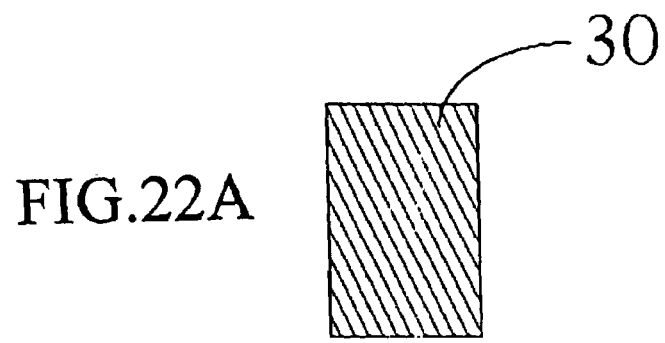
FIG.22A
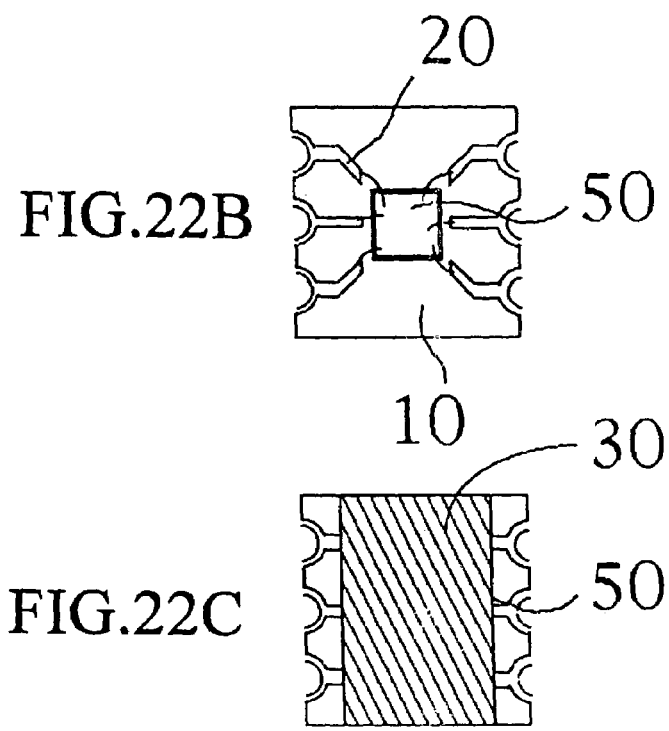
FIG.22B
FIG.22C
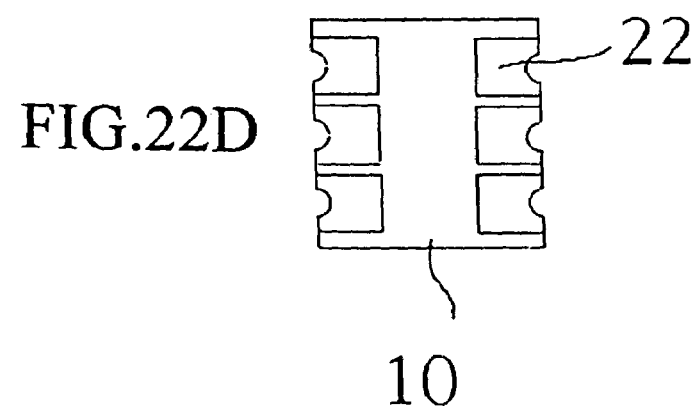
FIG.22D

CHARGE COUPLED DEVICE PACKAGE

This application is a division of application Ser. No. 08/902,223, filed Jul. 29, 1997, now abandoned.

INTRODUCTION

This invention relates to image sensor packages, in particular, packages for charge coupled devices.

Image sensors include charge coupled device sensors and complementary metal-oxide-semiconductor sensors. In conventional packaging of these devices, the image sensor is mounted on a ceramic substrate with protruding pins. After wire-bonding and window sealing, the pins are cut to proper length to complete the packaging process.

FIG. 1 shows the basic ceramic base 99 of a conventional package. A ceramic substrate 16 is mounted with a ceramic frame 15 through ceramic glass 17. The ceramic glass is imbedded with pins 14. After assembling, the structure is heated at high temperature to melt the ceramic glass 17, the ceramic frame 15, the conductor pins 14 and the substrate 16 are consolidated into a unitary structure 99.

FIG. 2 shows how an image sensor 50 is mounted on the ceramic base 99. The image sensor 50 is placed over the middle of the substrate 16 and glued to the substrate with silver epoxy 502. Bonding wires 504 are used to connect the output pads of the image sensor to the conductor pins 14. Then a transparent glass cover is glued to the frame 99 with sealing compound 19. After high temperature heat treatment, the structure is solidified, and the pins 14 are cut to proper length using a high precision cutting machine. FIG. 3 shows a completed package.

Such a packaging technique requires special ceramic material and high precision machinery. The biggest drawback of such a package is that every different shape of frames requires a dedicated mold for sealing the package. If the number of pins are different, the mold must be different. Another shortcoming is that the protruded pins are easily damaged by external force. Furthermore, when the number of pins is increased, the degree of difficulty in manufacturing is increased rapidly.

Still another shortcoming of the conventional technique is the sealing process. Whenever the specification of the product is changed, a new mold for the seal must be provided to properly seal the package.

SUMMARY

The first object of the present invention is to develop an image sensor package which is simple to manufacture and low in cost.

A second object of this invention is to develop an image package which is suitable for mass production.

A third object of this invention is to develop an image sensor package which is suitable for mounting in a printed circuit board.

A fourth object of this invention is to develop an image sensor package which is suitable for serving as a multiple-chip package in mass production.

A fifth object of this invention is to develop an image sensor package which can be easily sealed for different shapes of image sensors.

A sixth object of this invention is to develop an image sensor package which is suitable for mounting different shapes of image sensors.

A seventh object of this invention is to develop an image sensor package which is suitable for mounting image sensor chips in mass production.

These objects are achieved in this invention by using a printed wiring frame, in which a substrate is plated with a spider web of conductors. The inner end of the conductor is connected to a bonding pad of the IC chip, and the outer end is connected to a via hole which is connected to the bottom of the printed wiring frame for external connection, thus avoiding any protruding pins.

The structure is amenable to mass production. A large number of these printed wiring frames are arranged as a matrix on a common substrate. These frames can either be sealed column by column or all at once. The common substrate are then diced as individual packages, thus avoiding the expense of individually sealing the packages.

BRIEF DESCRIPTION OF THE DRAWINGS

FIGS. 22A,B,C,D show the top seal, cross-section, top view and bottom view respectively of an image sensor package with double-side output terminals.

DETAILED DESCRIPTION OF THE PREFERRED EMBODIMENT

Figure 1:
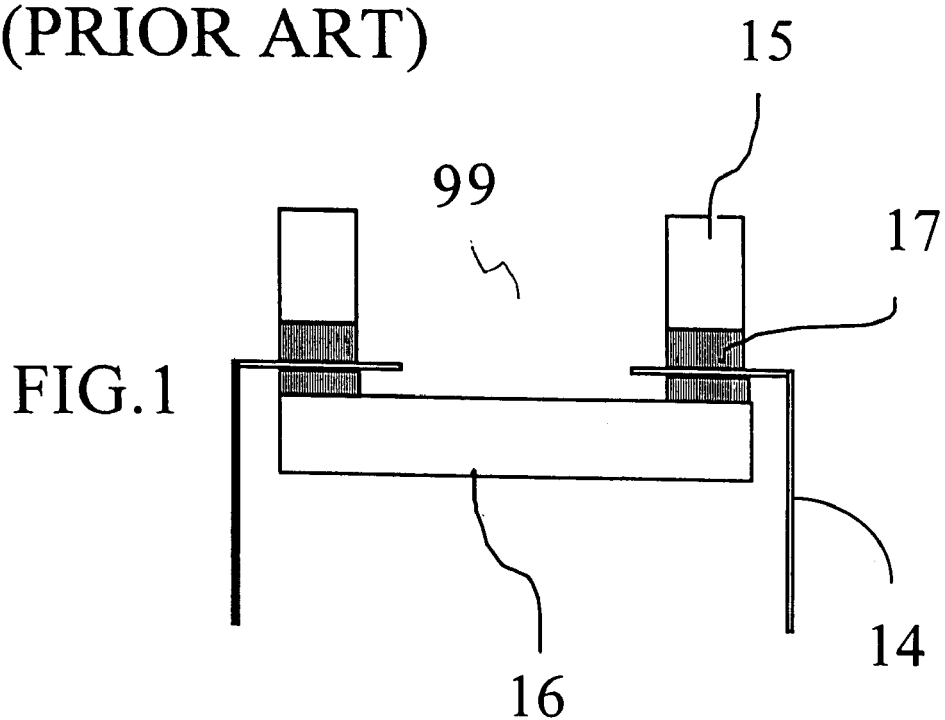
FIG. 1 shows the frame of a prior art package for mounting an image sensor chip.
Figure 2:
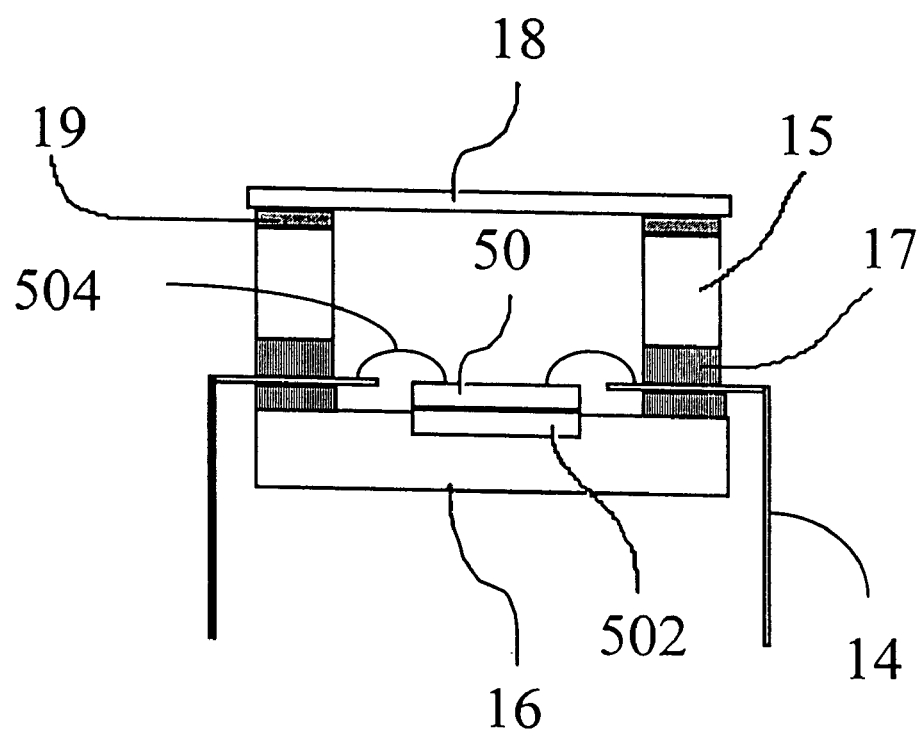
FIG. 2 shows the prior art dual in-line package with a cut-away view of the mounted image sensor chip.
Figure 3:
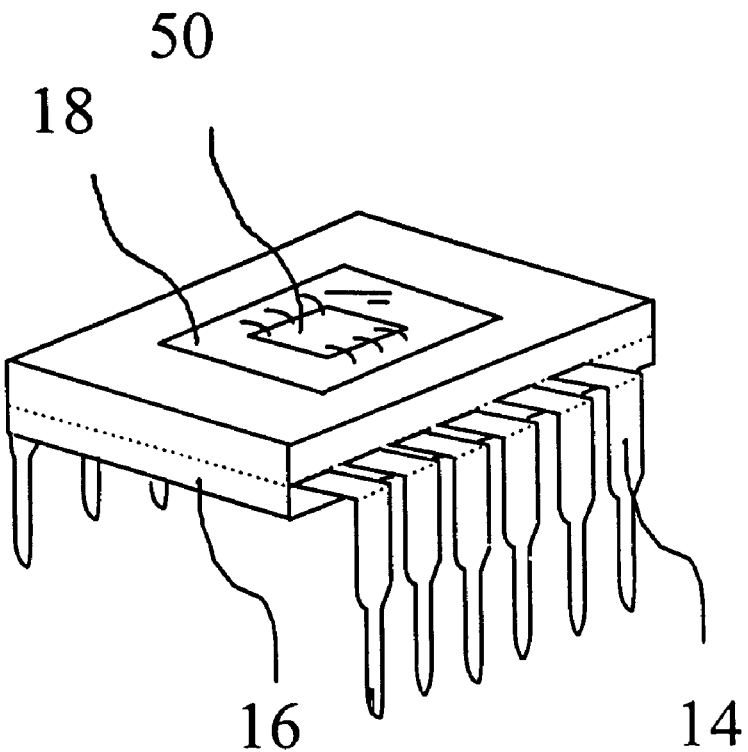
FIG. 3 shows a prior art dual in-line package.
Figure 4:
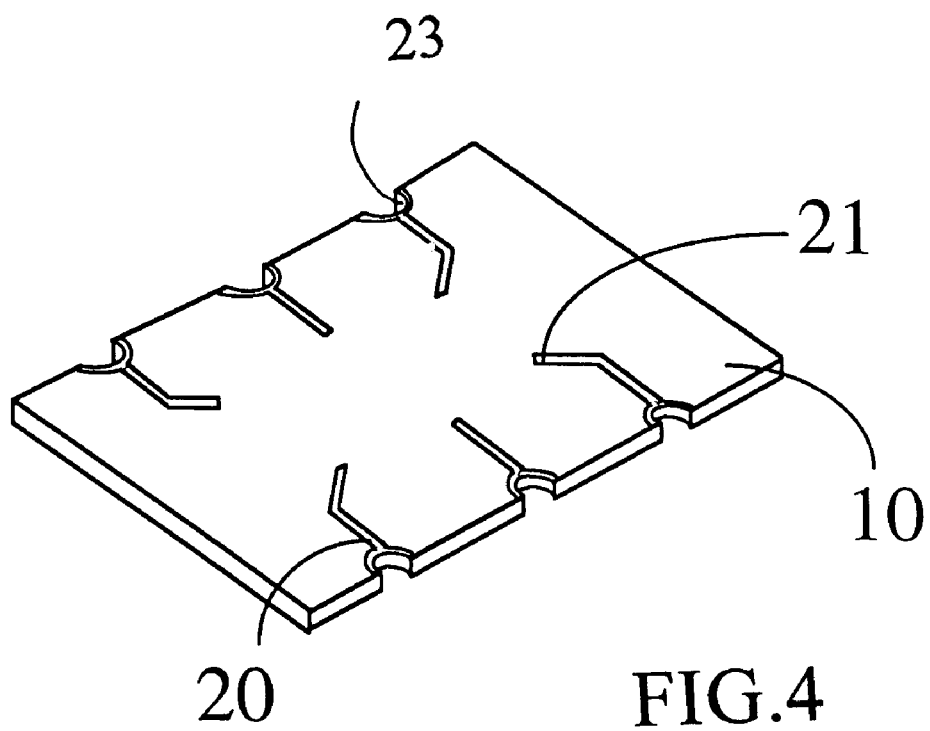
FIG. 4 shows the printed wiring fame of the present invention.
Figure 5:
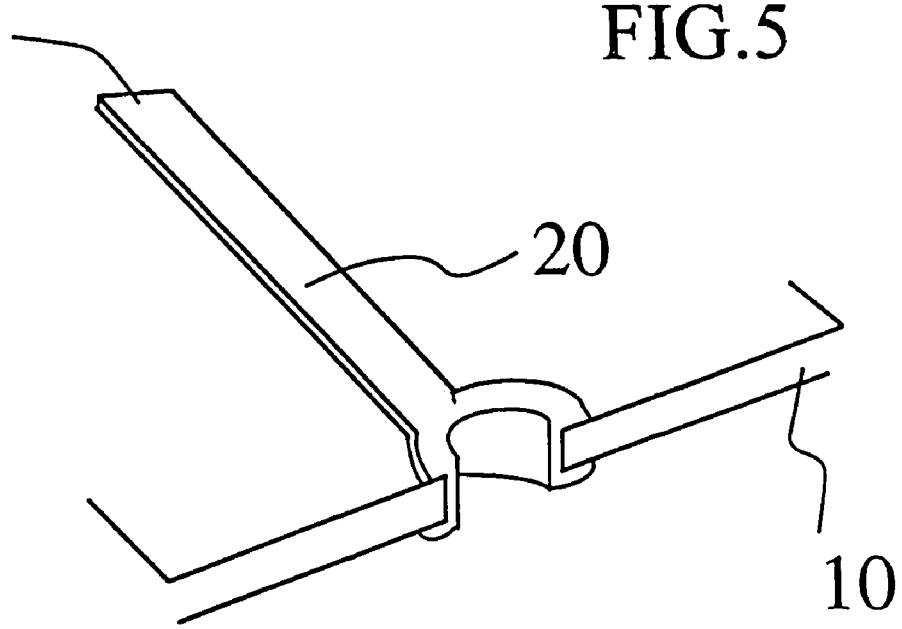
FIG. 5 shows the via hole at the edge of printed wiring frame.
Figure 6:
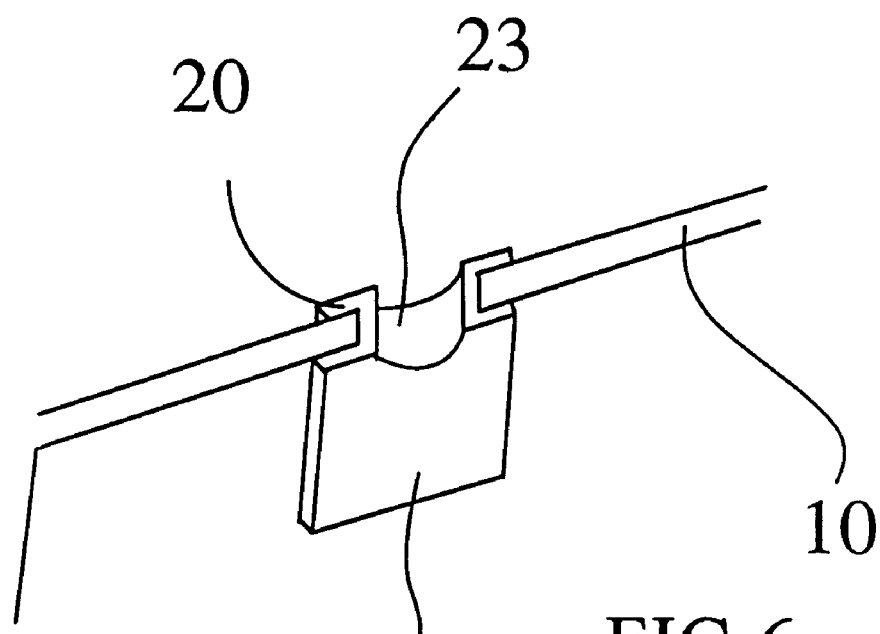
FIG. 6 shows the terminal pad connected to the via hole at the bottom of the printed wiring frame.
Figure 7:
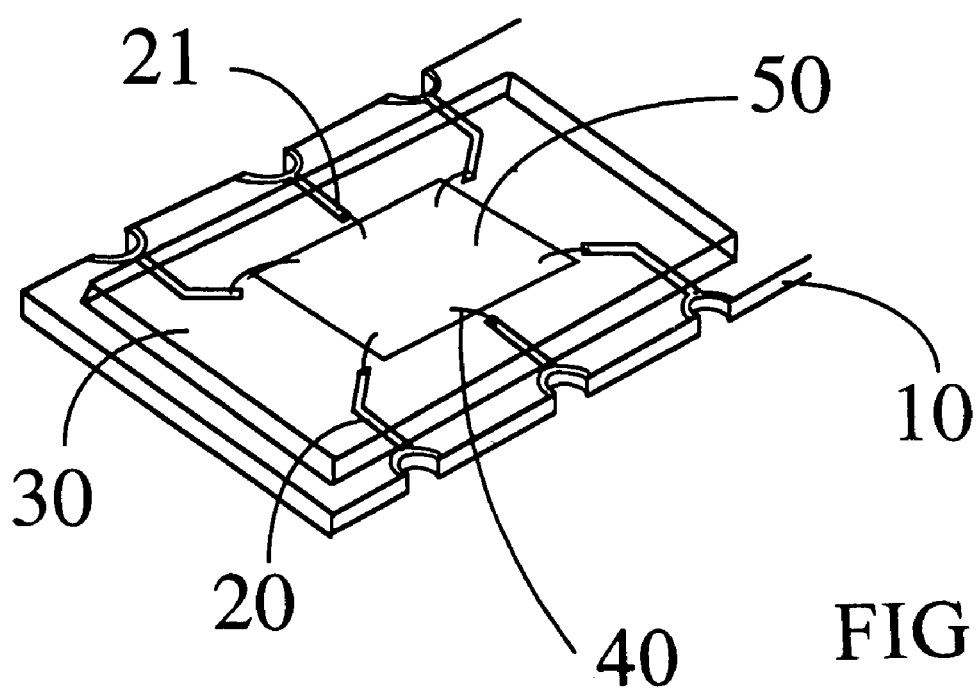
FIG. 7 shows a printed wiring frame mounted with an image sensor chip.

FIG. 4 shows a printed circuit interconnection frame of the present invention. A number of printed conductors 20 are plated on an inslating substrate 10. Each plated conductor forms an independent conductor 20. The inner ends 21 of the conductor are used to connect the output terminals of an image sensor chip. The outer ends of the conductor 20 is connected to a plated via hole 23, which, in turn, is connected to the bottom side of the substrate 10. FIG. 5 shows an enlarged view of the conductor 20. The inner end of the conductor is used to connect to an output terminal of an image sensor chip. The output end of the conductor 20 wraps over the via hole as shown in FIG. 6 and forms a pad 22 at the bottom side of the substrate 10, which constitutes the output terminal of the image sensor chip 50. FIG. 7 shows a cutaway view of the image sensor package according to the present invention. An image sensor chip 50 is mounted on the center part of the substrate 10. A bonding wire 40 is used to bond the end 21 of the independent conductor 20 to an output terminal of the image sensor chip 50. Transparent glue 30 is used to seal the image sensor chip 50, the bonding wire 40 and the conductors 20 to the substrate 10. The external connection to the image sensor chip 50 is through the pad 22 at the bottom of the substrate. The biggest difference of the present invention is the elimination of the "lead frame" used in a conventional IC package. Instead, this invention uses a "printed wiring frame". The package of the present invention does not have any pins protruding out from the package.

The present invention may use an image sensor chip with output pads facing upward, which are then wire bonded to the conductor 20. The image sensor chip 50 may also be soldered directly to the end 21 of the conductor 20, thus eliminating the wire-bonding step.

The bottom of the image sensor chip 50 can be mounted on a heat dissipating pad to reduce the temperature of the IC chip. This pad may also be used as an electrical terminal of the IC.

Figure 8:
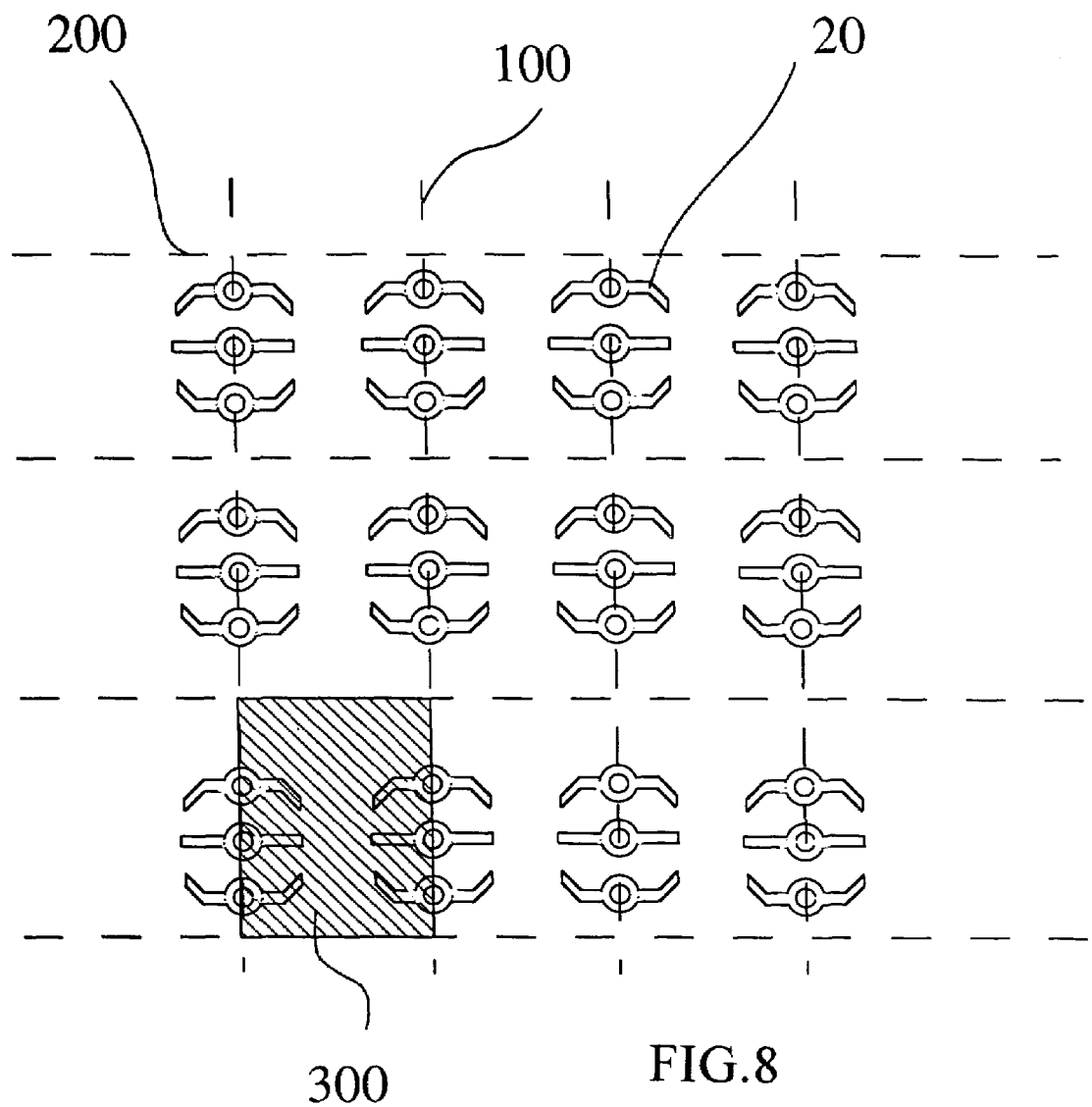
FIG. 8 shows a matrix of printed wiring frames batch processed for mass production

FIG. 8 shows the mass production technique for the present invention. A large of printed wiring frame 300 units are printed on a common substrate, and the substrate is later diced along the horizontal lines 200 and vertical lines 100 to form individual units.

Figure 9:
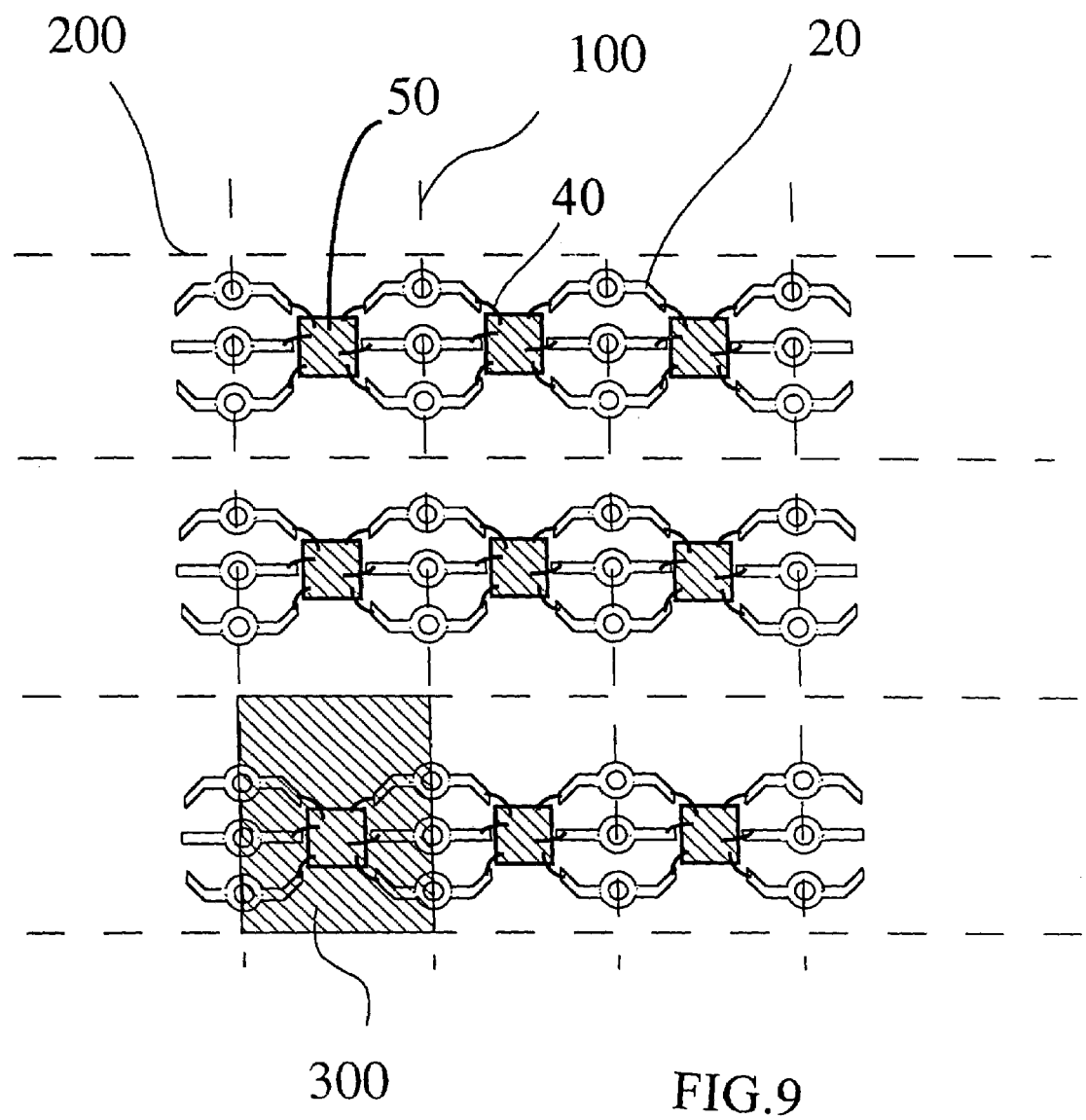
FIG. 9 shows the matrix of printed wiring frames mounted with image sensor chips and wire-bonded to the plated conductors of the printed wiring frames.

FIG. 9 shows how the image sensor chips 50 are mounted on the "printed wiring frame" 300. After the wire-bonding with wires 40 from the image sensor chip 50 to the to the conductor 20 and sealing the package with transparent glue, the substrate is diced along the horizontal lines 200 and along the vertical lines 100 to yield a large number of packaged image sensors. This invention allows sealing the image sensors in a batch process instead of each individual sealing, thus greatly reducing the cost of packaging and enhancing the speed of mass production.

Figure 23A:
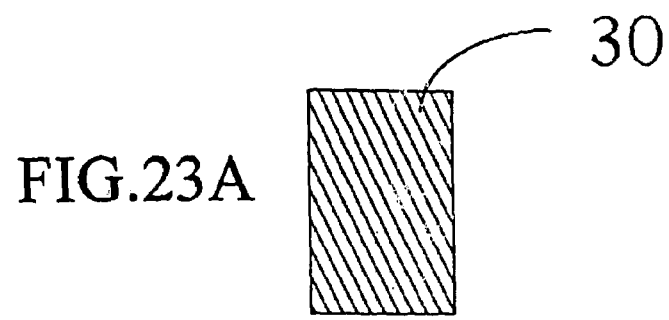
FIGS. 23A,B,C,D show the top seal, cross-section, top view and bottom view respectively of an image sensor package with triple-sided output terminals.
Figure 23B:
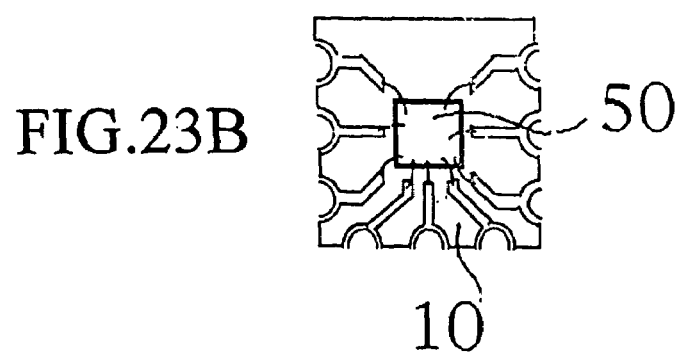
Figure 23C:
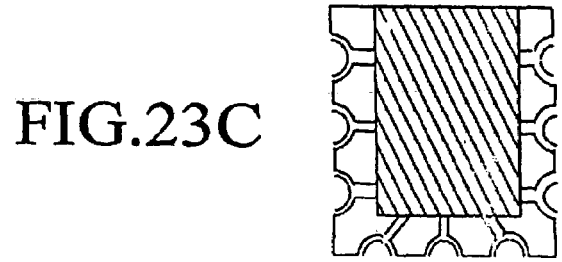
Figure 23D:
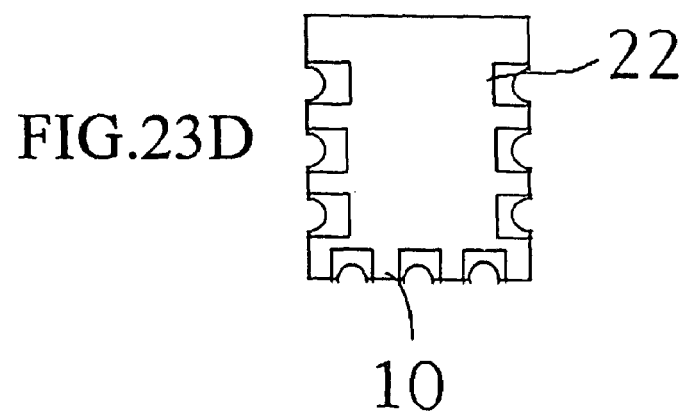
Figure 24A:
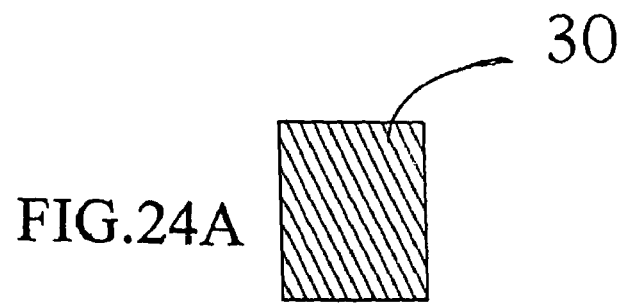
FIGS. 24A,B.C,D show the top seal, cross-section, top view and bottom view respectively of an image sensor package with quadruple-sided output terminals.
Figure 24B:
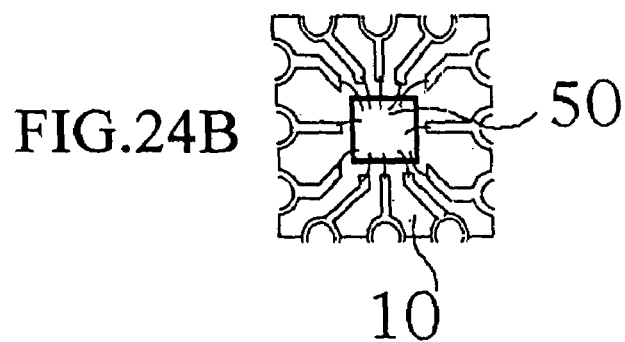
Figure 24C:
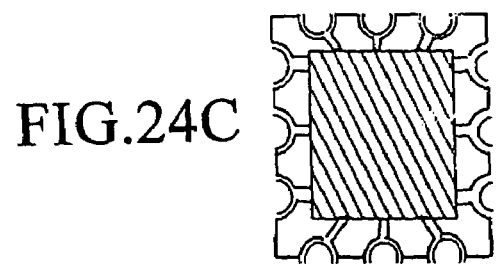
Figure 24D:
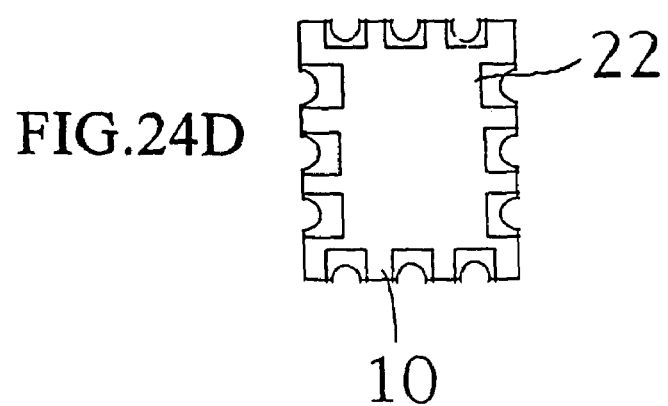

In addition, the seal can cover a portion of the printed wiring frame. The end product can have terminals at one edge, two edges, three edges and four edges, to be shown later in FIGS. 21A,B,C,D, FIGS. 22A,B,C,D, FIGS. 23A, B,C,D and FIGS. 24A,B,C,D to form single sided contacts, double-sided contacts, triple-sided contacts and quadruple-sided contacts.

Figure 10:
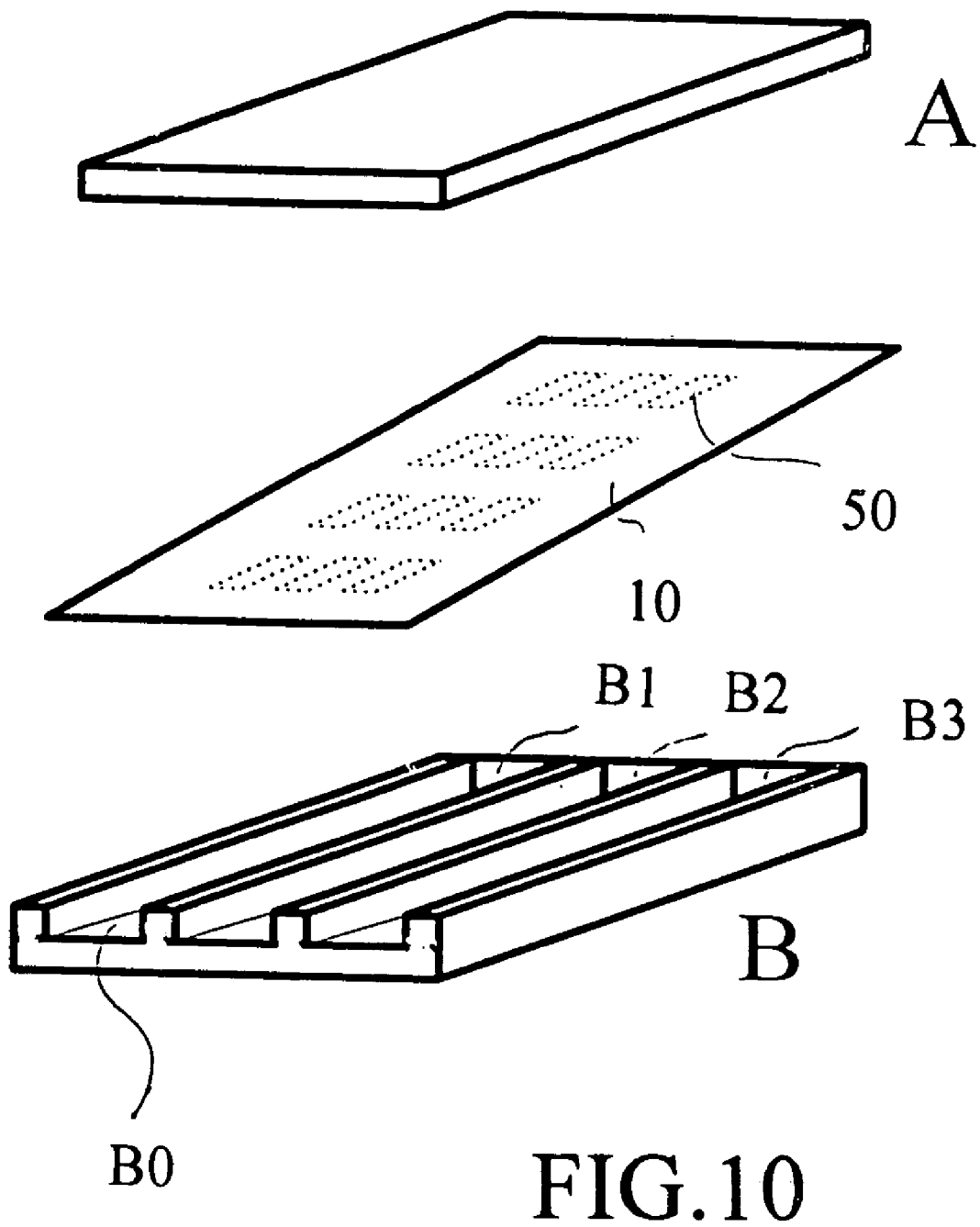
FIG. 10 shows a method of sealing a matrix of printed wiring frames.

FIG. 10 show the mold for sealing the package of the present invention. The mold has a male part A and a female part B. The male part A is a flat plate. The female part B has grooves. Three grooves B1, B2 and B3 are shown in FIG. 10. B0 is the inlet for the transparent sealing compound to flow in. All the grooves can be fed with the transparent sealing compound simultaneously to seal a large number of IC chips 50 along each groove. The width along each groove is uniform. The length of the seal can be cut any desired length In conventional packaging technique, the length of the seal cannot be changed. For different lengths, the mold must be custom-made. In the present invention, no individual molds are needed for different lengths so long as the widths are the same. FIG. 10 shows a substrate 10 mounted with twelve image sensor chips 50 arranged in a matrix of three columns. All the twelve image sensor chips can be impressed with transparent glue simultaneously. In so doing, hundreds and thousands of image sensor chips can be sealed at the same time.

Figure 11:
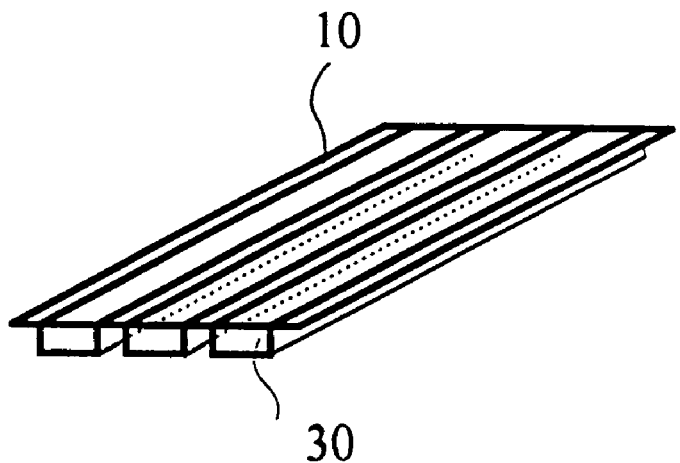
FIG. 11 shows three grooves for feeding the sealing compound to the printed wiring frames as example for mass production.

FIG. 11 shows the shape of the common substrate 10 impregnated with the transparent sealing compound 30 and cut into three columns. The sealing compound 30 is located beneath the substrate 10. The edges of the substrates comprises the output terminals 22 of the plated conductors 20 as shown in FIG. 12.

Figure 12:
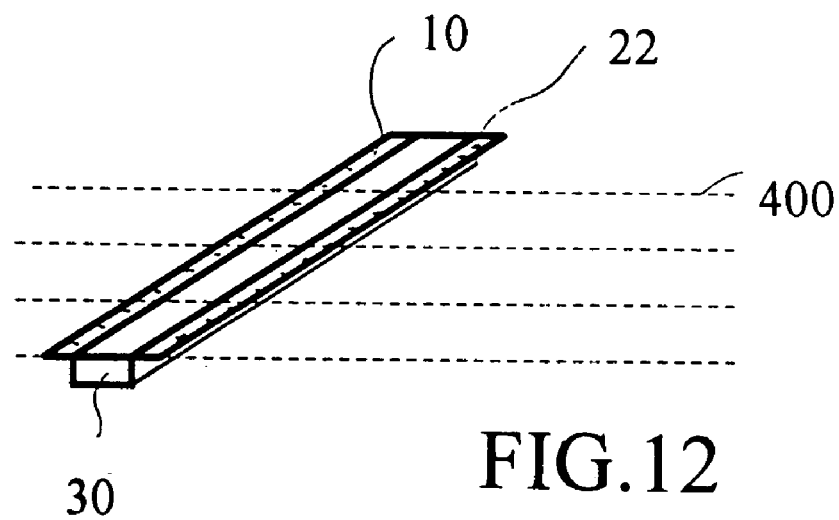
FIG. 12 shows how a groove is to be cut.
Figure 13:
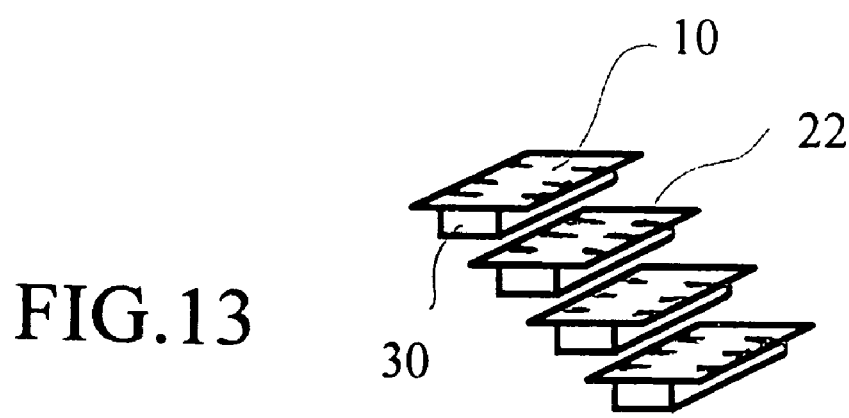
FIG. 13 shows the diced image sensor packages.

FIG. 13 shows the individual IC packages after the substrate 10 is cut along the horizontal line 400 in FIG. 12.

Figure 14:
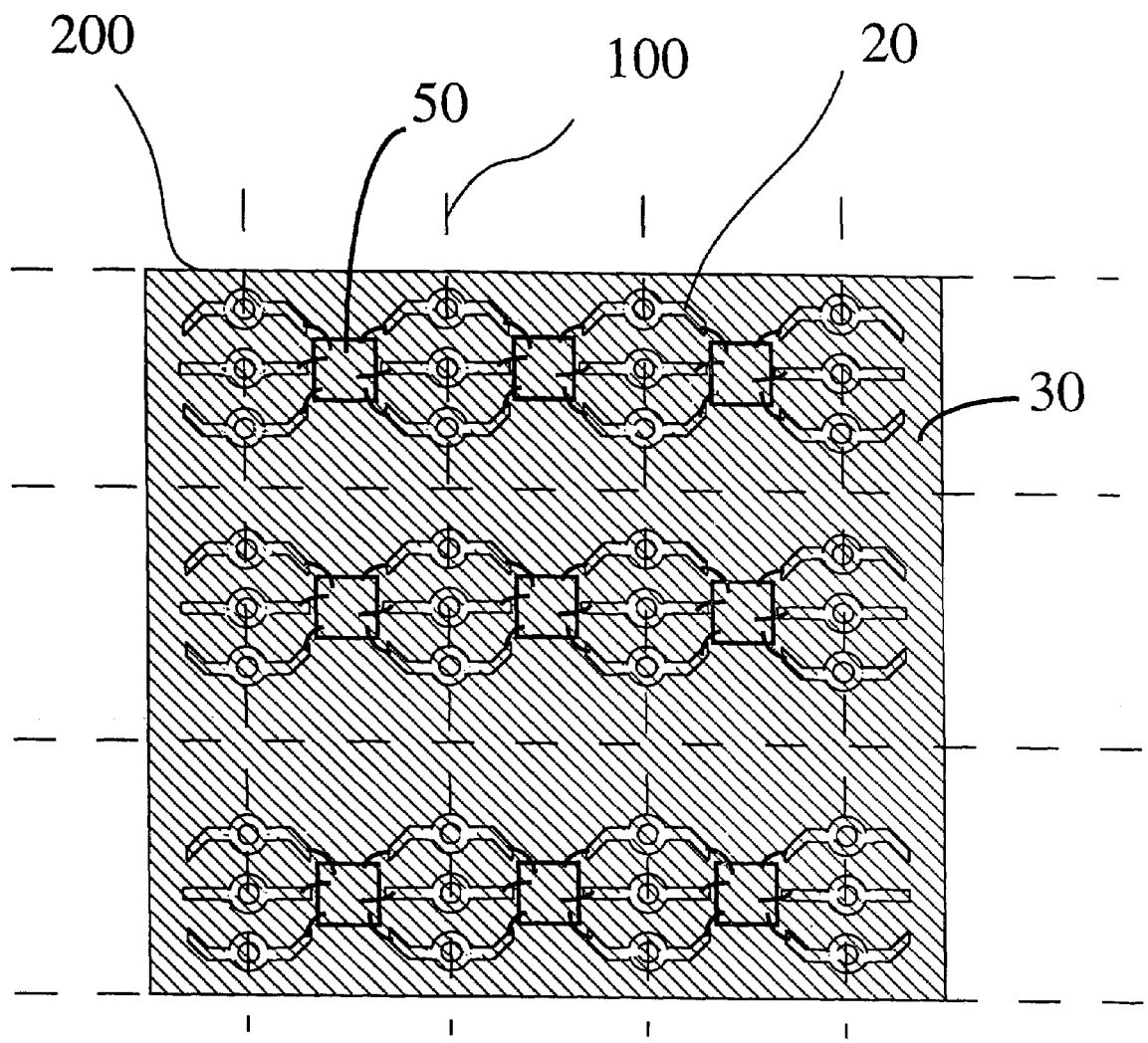
FIG. 14 shows an entire matrix of image sensor packages are covered with a common seal.
Figure 15A:
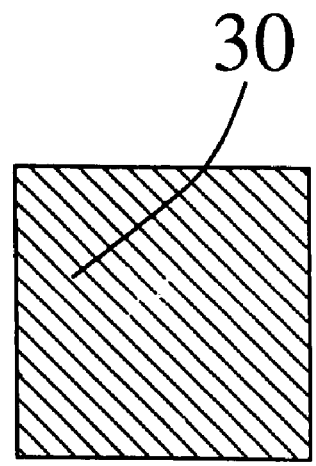
FIG. 15A shows the top view of a diced image sensor package.
Figure 15B:
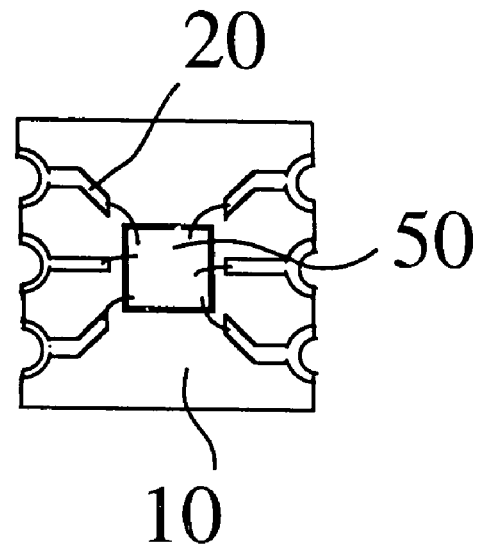
FIG. 15B shows the printed wiring frame of a diced package.
Figure 15C:
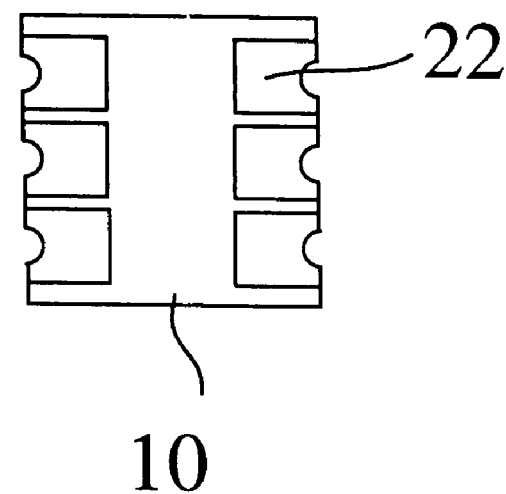
FIG. 15C shows the bottom terminal pads of a diced package.

FIG. 14 shows how the substrate is completely sealed by the transparent sealing compound 30 (in section lines). After dicing, the individual die is shown in FIG. 15A. FIG. 15B shows the view below the seal 30 with an image sensor chip 50 and plated conductors 20. FIG. 15C shows the bottom view of the package with the outer terminals 22 of the plated conductors 20.

Figure 16:
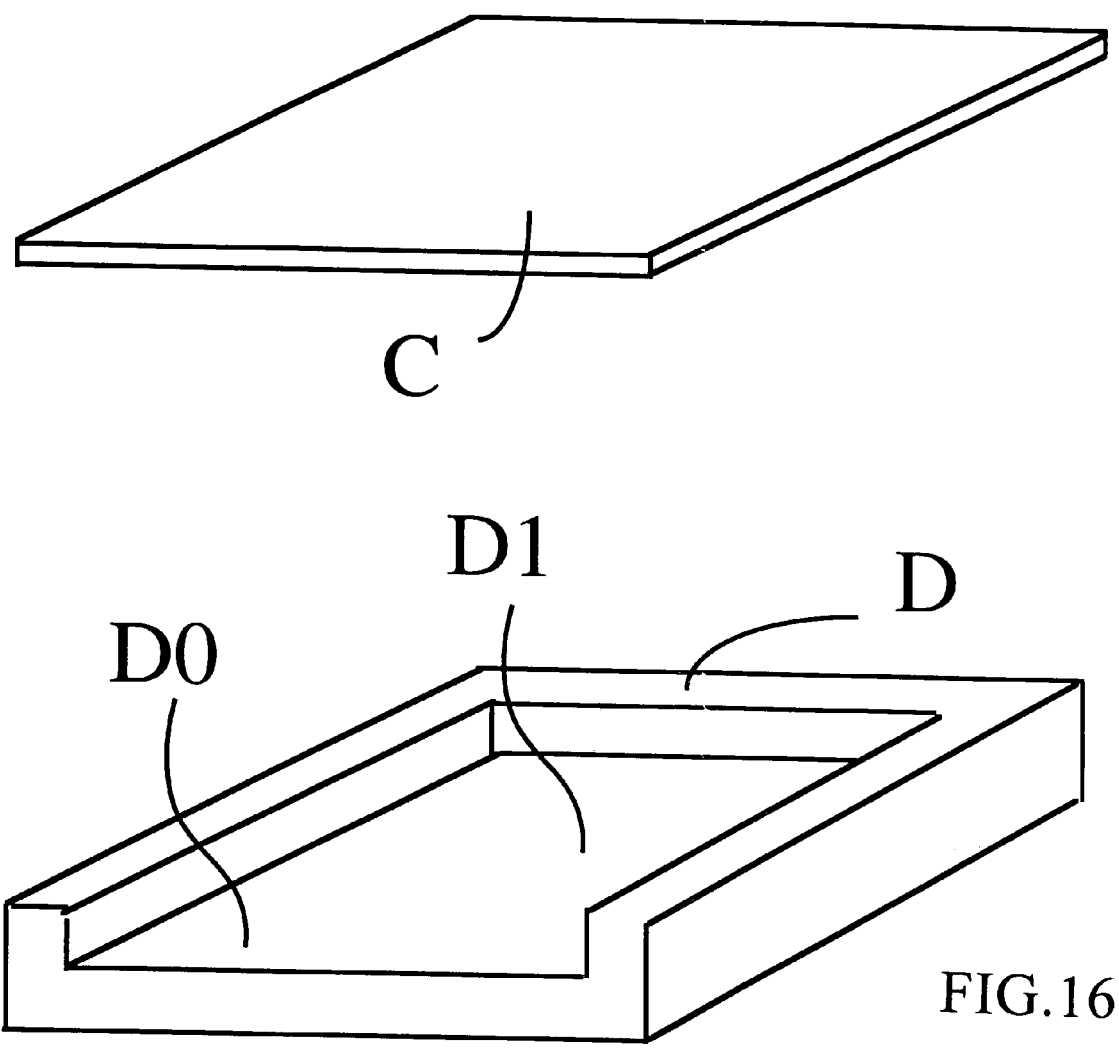
FIG. 16 shows a mold for feeding sealing compound to a matrix of printed wiring frames.

FIG. 16 shows the special mold for the transparent sealing compound. The female part of the mold has a recess D1 and a wall D. The male part C is a flat plate. The recess region D1 has an inlet D0 for the transparent sealing compound to flow in. In this way, a large number of image sensor chips can be sealed at the same time. After sealing the image sensors can be diced into proper sizes.

Figure 17:
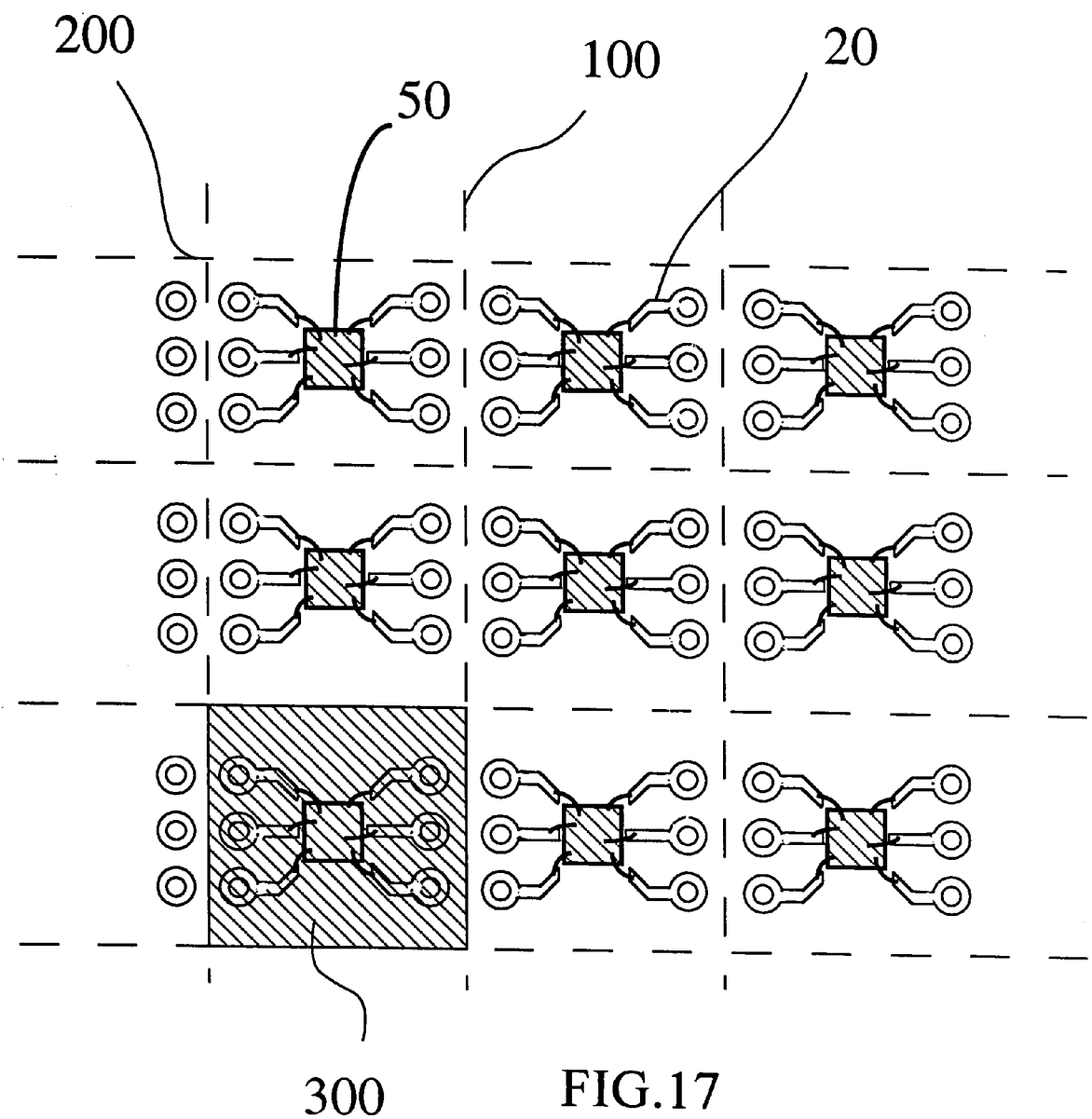
FIG. 17 shows the via holes placed inside the edge of the printed wiring frames.
Figure 18A:
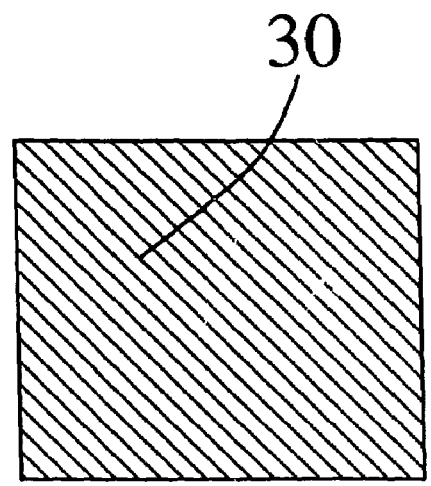
FIG. 18A shows the top view of a die as constructed in FIG. 17.
Figure 18B:
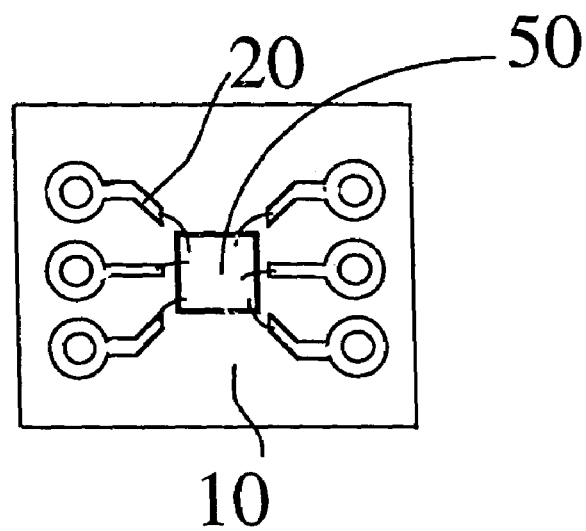
FIG. 18B shows the printed wiring frame of a die as constructed in FIG. 17.
Figure 18C:
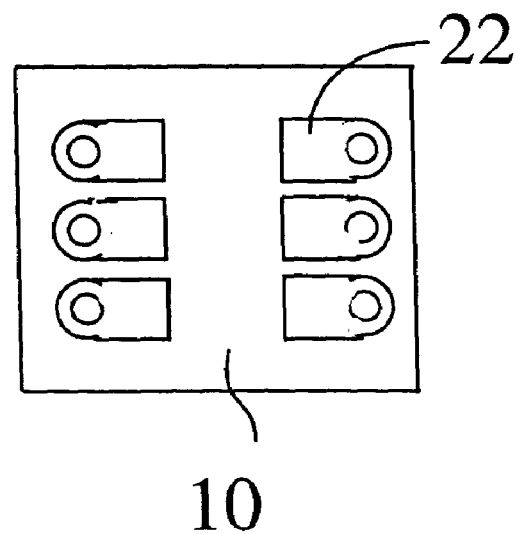
FIG. 18C shows the bottom view of a die as constructed in FIG. 17.

In FIG. 17 is shown another structure of the via holes, which are placed inside the edge of the printed wiring frame. The printed wiring frames are diced along the horizontal lines 200 and vertical lines 100. In this figure, each side of the image sensor chips is drilled with three via holes for a total of six holes, assuming the image sensor has six output terminals. After dicing, FIG. 18A show the top view with seal 30; FIG. 18B shows the view beneath the seal with the image sensor chip 50, plated conductor 20 and substrate 10; FIG. 18C shows the bottom view the package with output pads 22.

Figure 19A:
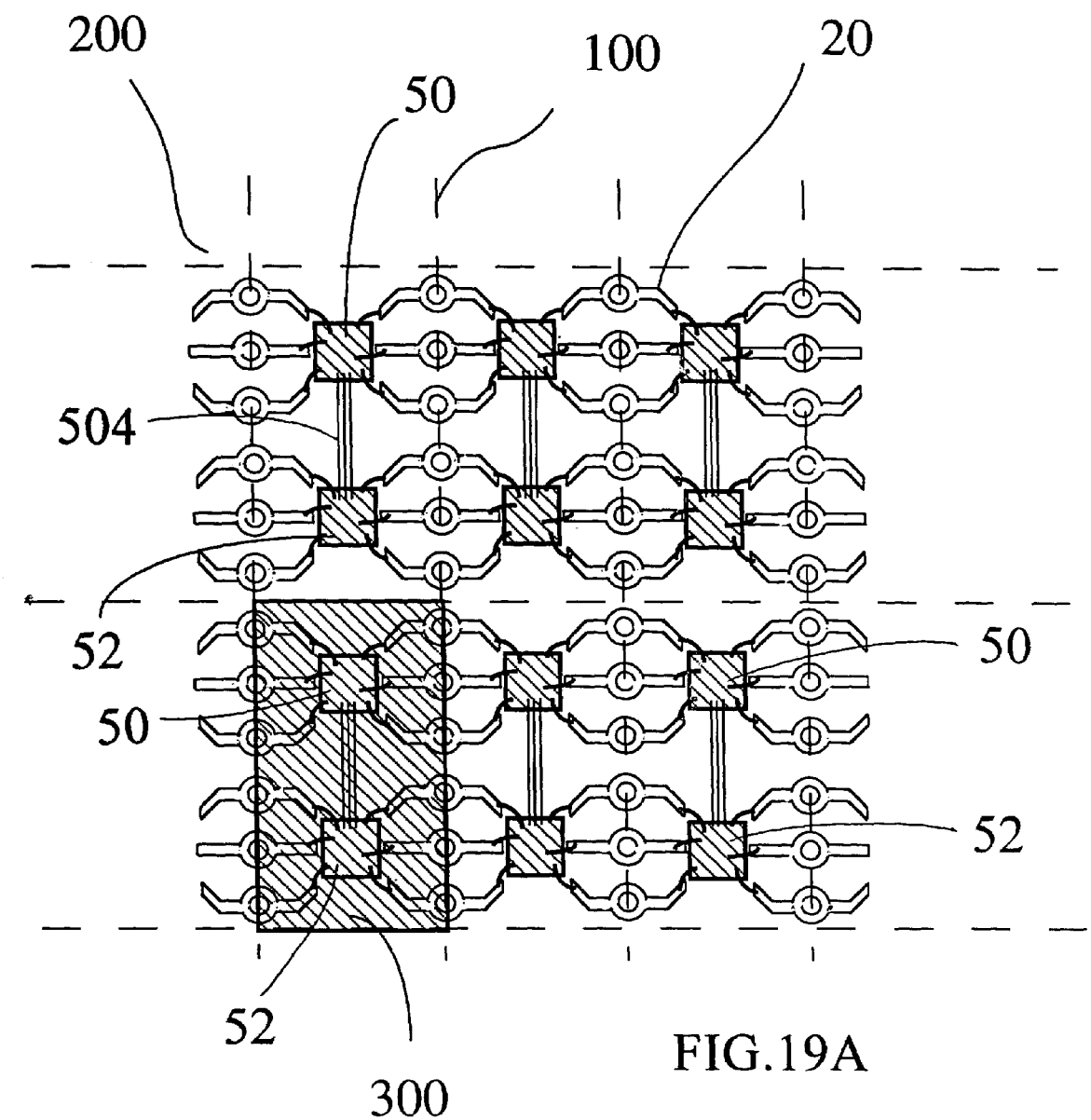
FIG. 19(A) shows how one image sensor chip is interconnected by wire-bonding with another integrated circuit chip in a single die to yield a multiple-chip package.
Figure 19B:
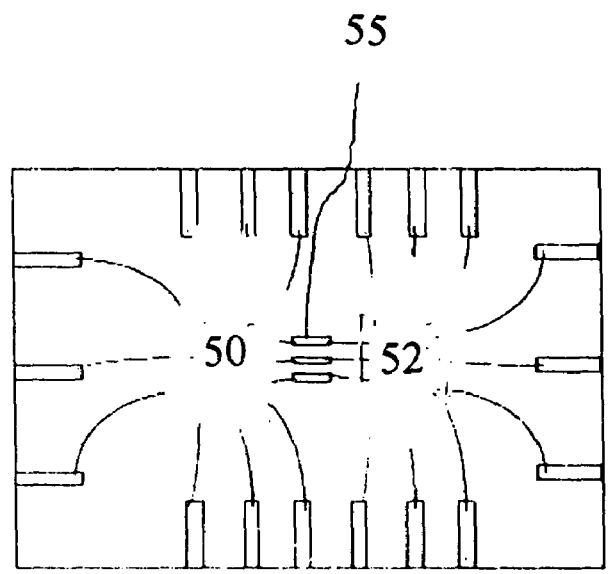
FIG. 19(B) shows how the two chips are interconnected by wire bonding through a connector plate.
Figure 19C:
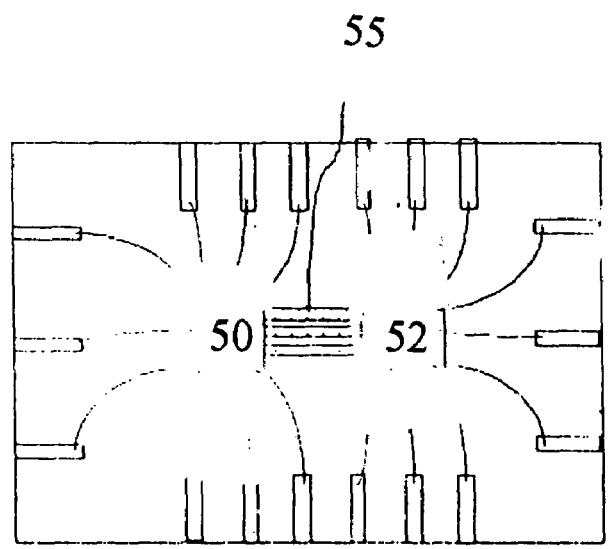
FIG. 19(C) shows how the two chips are interconnected by flip-chip solder-bonding through connector plate.

FIG. 19(A) shows a "chip set", in which one image sensor chip is interconnected with a peripheral integrated circuit (IC) chip. In this figure, an image sensor chip 50 is interconnected with an IC chip 52 in a single package 300. The interconnections 504 may be wire bonded as shown in FIG. 19(A). The interconnections may also be made by wire bonding to a connector plate 55 as shown in FIG. 19(B), or by flip-chip solder bonding to a connector plate 55 as shown in FIG. 19(C). If more than two IC chips are used to form a chip set, the interconnection can also be made in similar manner.

Figure 20:
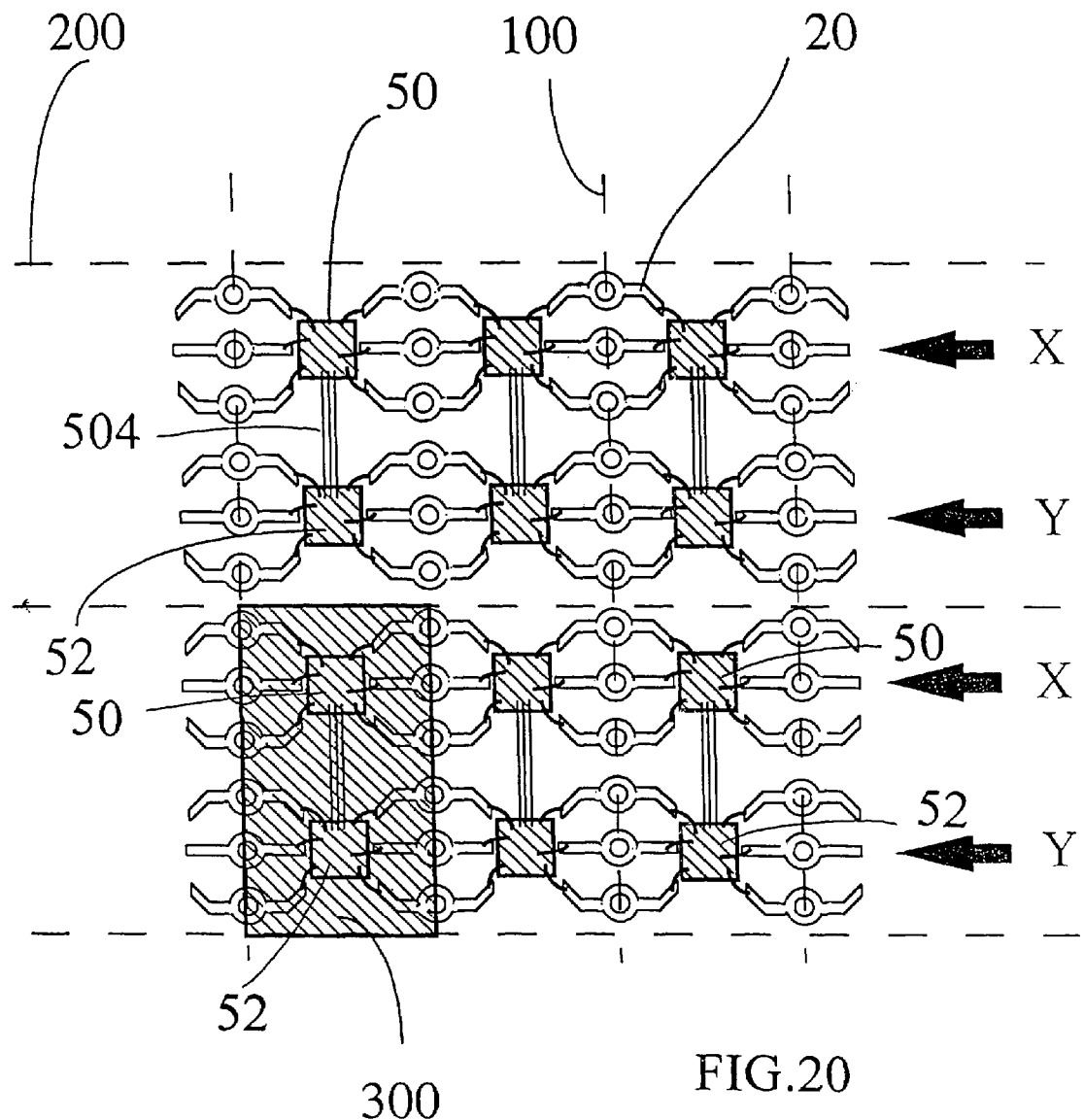
FIG. 20 shows a how an image sensor chip and an integrated circuit chip are alternately sealed.

FIG. 20 shows a structure in which the image sensor chips are sealed with transparent glue and the IC chip is sealed with opaque glue. This structure can be made by feeding alternately transparent glue along the X-rows and opaque glue along Y-rows.

Multiple-layered boards can have more interconnection possibilities. Thus if the substrate 10 is made of a multiple-layered board, the terminal positions of the IC can be changed. For instance, if the first output of the IC chip 50 is connected to first terminal of the printed wiring frame. By using a multiple-layered board, the first terminal can be changed to be the second terminal Thus the IC chip need not change the layout and yet achieve more leeway in design.

Figure 21A:
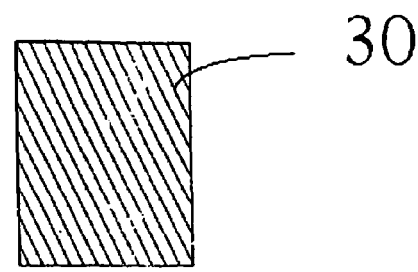
FIGS. 21A,B.C.D show the top seal, cross-section, top view and bottom view respectively of an image sensor package with single-sided output terminals.
Figure 21B:
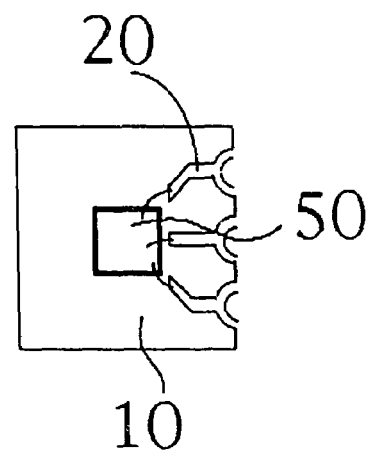
Figure 21C:
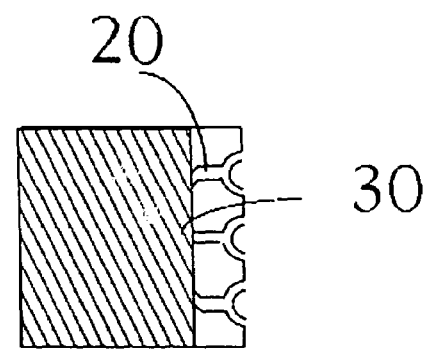
Figure 21D:
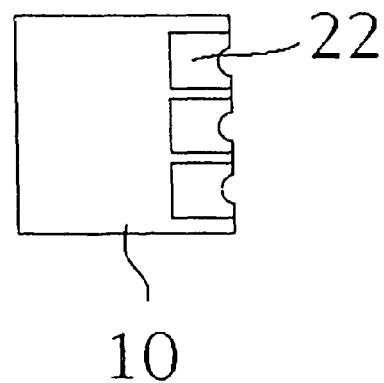

The image sensor package may have output pads located in one or more sides. FIGS. 21A,B,C,D show the top seal, the cross-section, top view and the bottom view respectively of an image sensor package with sided-sided output. FIGS. 22 A,B,C,D show the top seal, the cross-section, the top view and the bottom view respectively of an image sensor package with double-sided output. FIGS. 23.A,B,C,D show the top seal, the cross-section, the top view and the bottom view respectively of an image sensor with triple sided output. FIGS. 24 A,B,C,D show the top seal, the cross-section, the top view and the bottom view respectively of an image sensor with quadruple-sided output.

The foregoing descriptions are merely examples of the preferred embodiment. The invention is by no mean limited to these examples. Any equivalent techniques to implement image sensor package are all within the scope of this invention.

The invention claimed is:

1. A method of mass producing a multiplicity of image sensor packages on a common substrate, each of said packages having:
   an image sensor chip with multiple output terminal,
   a printed wiring frame having at least one conductor thereon,
   said conductor having one end coupled to one of said output terminals,
   said conductor having a second end extending to the bottom of said printed wiring frame;
   the method comprising the steps of:
   printing a large number of said printed wiring frame on a common substrate as a matrix, and
   dicing said common substrate into said number of said printed wiring frames,
   wherein said transparent seal is fed through a mold having a male part and a female part, said female part having parallel grooves aligned with said image sensor ackaes in the same column of the matrix and an inlet at one end of each of said grooves to feed a sealing compound to form said seal, said male part being a flat plate pressing said substrate against said female part.

2. The method of mass producing a multiplicity of image sensor packages as described in claim 1, further comprising a step of covering a number of said printed wiring frame along each column of said matrix with a common transparent seal before the dicing step.

3. The method of mass producing image sensor packages as described in claim 1, further comprising the step of sealing all the said image sensor packages with a common transparent seal before the dicing step.

4. A method of mass producing a multiplicity of multiple-chip packages on a common substrate, each package having:
   image sensor chip and at least one integrated circuit chip, each having multiple output terminals,
   a printed wiring frame having at least one conductor thereon,
   said conductor having a first end coupled to one of said output terminals, and a second end extending to the bottom of said printed wiring frame,
   comprising the steps of:
   printing a large number of said printed wiring frame on a common substrate as a matrix, and
   dicing said common substrate into said number of said printed wiring frame.

5. The method of mass producing a multiplicity of image sensor packages as described in claim 4, wherein said image sensor chip and said integrated circuit chip are connected by wire bonding.

6. The method of mass producing a multiplicity of image sensor packages as described in claim 4, wherein said image sensor chip and said integrated circuit chip are interconnected by bonding to said first end of more than one said first conductor of said printed wiring frame.

7. The method of mass producing a multiplicity of multiple chip packages as described in claim 4, further comprising the step of sealing said image sensor chips and said integrated circuit chips.

8. The method of mass producing a multiplicity of multiple chip packages as described in claim 7, wherein said packages are sealed with transparent glue.

9. The method of mass producing a multiplicity of multiple chip packages as described in claim 7, further comprising the step of sealing said image sensor chips with transparent glue and sealing said integrated circuit chip with opaque glue.

10. The method of mass producing a multiplicity of images sensor packages as described in claim 7, wherein said transparent glue and said opaque glue are fed in alternate rows.

* * * * *